United States Patent [19]

Sharma et al.

[11] Patent Number: 5,736,872
[45] Date of Patent: Apr. 7, 1998

[54] LOW VOLTAGE HIGH SPEED PHASE FREQUENCY DETECTOR

[75] Inventors: Vivek Sharma, Le Fontanil; Davoud Samani, Saint Martin le Vinoux, both of France

[73] Assignee: SGS-Thomson Microelectronics S.A., Saint Genis, France

[21] Appl. No.: 665,007

[22] Filed: May 31, 1996

Related U.S. Application Data

[63] Continuation of Ser. No. 380,847, Jan. 30, 1995, abandoned.

[30] Foreign Application Priority Data

Jan. 31, 1994 [EP] European Pat. Off. ............ 94410004

[51] Int. Cl.⁶ .................................................. H03D 13/00
[52] U.S. Cl. ............................................. 327/3; 327/12
[58] Field of Search ................................. 327/3, 5, 7, 12, 327/18, 198, 199, 215, 217, 219, 225, 202, 147, 156, 149, 150, 158, 159

[56] References Cited

U.S. PATENT DOCUMENTS

| | | | |
|---|---|---|---|
| 3,812,384 | 5/1974 | Sakorup | 327/217 |
| 4,179,628 | 12/1979 | Ohgishi et al. | 327/3 |
| 4,291,274 | 9/1981 | Suzuki et al. | 327/7 |
| 4,322,643 | 3/1982 | Preslar | 307/528 |
| 4,378,509 | 3/1983 | Hatchett et al. | 307/528 |
| 4,864,252 | 9/1989 | Heck | 331/1 A |
| 4,893,034 | 1/1990 | Tamaru | 327/198 |
| 4,970,475 | 11/1990 | Gillig | 327/3 |
| 5,072,195 | 12/1991 | Graham et al. | 327/7 |
| 5,095,287 | 3/1992 | Irwin et al. | 331/1 A |
| 5,266,851 | 11/1993 | Nukui | 327/3 |
| 5,440,274 | 8/1995 | Bayer | 327/3 |

FOREIGN PATENT DOCUMENTS

405041638  2/1993  Japan ............................. 327/217

OTHER PUBLICATIONS

Sam Yinshang Sun, "An Analog PLL-Based Clock and Data Recovery Circuit with High Input Jitter Tolerance", The Journal of Solid-State Circuits, vol. 24, No. 2, Apr. 1989.
Patent Abstracts of Japan, vol. 14, No. 36 (e-877) (573) Jan. 23, 1990 & JP-A-55058634 (Hitachi K.K.).

*Primary Examiner*—Timothy P. Callahan
*Assistant Examiner*—My-Trang Nu Ton
*Attorney, Agent, or Firm*—Wolf, Greenfield & Sacks, PC; James H. Morris

[57] ABSTRACT

A circuit is described for detecting a difference in phase and frequency between two incoming signals. Digital output signals are produced whose widths vary according to a degree of phase lead or phase lag of one signal with respect to the other. First sub-circuits are connected, one to each of the input signals to produce an output pulse of short duration, compared with a period of the incoming signal, at rising transitions of the associated input signal. Two resettable pulse detection circuits each have an output set to a first stable state when an active signal is received on a reset input and which change to a second stable state when a short duration pulse is received from one of the subcircuits on a pulse input. Further circuitry is connected such that when both outputs of the resettable pulse detection circuits are in the second stable state, an active reset signal is supplied to both resettable pulse detection circuits, to return both of their outputs to the first stable state. The outputs of the resettable pulse detection circuits provide the outputs of the circuit.

53 Claims, 9 Drawing Sheets

LOW VOLTAGE HIGH SPEED PHASE FREQUENCY DETECTOR

CROSS REFERENCE TO RELATED APPLICATION

This application is a continuation in part of application Ser. No. 08/380,847, filed Jan. 30, 1995 now abandoned.

BACKGROUND OF THE INVENTION

1. Field of the Invention

The present invention relates to phase and frequency comparators used in phase locked loops and more particularly to two input/two output comparators, in which a first output provides a signal of greater duty cycle than a signal provided by a second output when a first input signal is in phase advance with respect to a second input signal, and in which a second output provides a signal of greater duty cycle than the signal provided by the first output, when the second input signal is in phase advance with respect to the first input signal.

2. Discussion of the Related Art

Phase locked loops (PLL) are well-known and popular circuit blocks. They find applications as clock generators, frequency or phase demodulators, frequency multipliers, clock recovery devices and 'cleaners' of noisy input signals.

Considering FIG. 1, all phase locked loops 1 consist of certain functional elements—a phase detector 2 which detects the difference in phase between two signals, one of which $F_{IN}$ is the input to the PLL circuit. The phase detector 2 produces signals 8, 9 which are then processed by circuitry 3,4,5 to form an analogue voltage level representative of the phase relationship between the two inputs to the phase detector 2. This analogue voltage is used to vary the output frequency $F_{OUT}$ of a voltage or current controlled oscillator 6.

The output $F_{OUT}$ of this oscillator 6 may couple directly to the second input signal $F_{BK}$ of the phase detector 2 to provide negative feedback. Alternatively, a frequency divider may be interposed between the output of the oscillator 6 and the second input of the phase detector 2 in order to obtain an oscillator output $F_{OUT}$ which has a frequency a multiple of that of the input signal $F_{IN}$. This multiple is determined by the division ratio of the frequency divider 7.

The functionality of such a circuit is as follows: the phase frequency detector 2 compares the phases of the first and second input signals $F_{IN}$, $F_{BK}$, being the PLL input signal and the feedback signal, respectively. The phase detector 2 produces an output, usually in the form of digital pulses, representing the phase difference between first and signal and the feedback signal, respectively. The phase detector 2 produces an output, usually in the form of digital pulses, representing the phase difference between first and second input signals. The input signal $F_{IN}$ will either lead, lag or be in phase with the feedback signal $F_{BK}$. If the PLL input signal $F_{IN}$ leads the feedback signal $F_{BK}$, the phase frequency detector 2 sends output pulses on what is normally called the UP output (to indicate that the oscillator needs to increase in frequency to reduce the phase difference between $F_{BK}$ and $F_{IN}$). These pulses are integrated by either a differential amplifier or a charge pump 3 and a low pass filter such as RC filter 4, 5 to adjust the DC voltage applied to the control input 10 of the controlled oscillator 6. This adjustment is responded to by the controlled oscillator 6 which increases the frequency of its output signal $F_{OUT}$. This will cause the phase difference between the two signals to the phase detector to decrease. The duration of the pulses from the phase detector will decrease, the DC voltage on the capacitor 5 will tend to stabilise due to the filter time constant (fixed by the values of resistor 4 and capacitor 5) and hence the frequency of the feedback signal $F_{BK}$ will approach that of the PLL input signal $F_{IN}$. When the frequencies are equal and the phases of the two signals $F_{IN}$, $F_{BK}$ are identical, no pulses are produced by the phase detector 2 and the loop is said to be 'locked in'. Any mild variation in the input frequency or phase will be followed by the output of the controlled oscillator. The allowable range for such variations depends on the characteristics of the controlled oscillator and the filter. If the PLL input signal $F_{IN}$ lags the feedback signal $F_{BK}$, the phase detector 2 will produce pulses on its second output DN to instruct the controlled oscillator 6 via the differential amplifier or charge pump 3 and filter 4, 5 to reduce the frequency of its output signal $F_{OUT}$. As above, the feedback frequency will approach the input frequency and phase until lock in occurs.

By using a divider 7 in the feedback loop, the output signal $F_{OUT}$ of the oscillator will be at a multiple of the frequency of the PLL input signal $F_{IN}$, phase locked to it. If a divide-by-N counter is used, the output of the oscillator $F_{OUT}$ will be at a frequency N times that of the input signal, $F_{IN}$.

Schematically shown in FIG. 2 is one type of known phase detector, using RS latches. RS latches are well known in the art, and are used as circuit building blocks with the following function: an RS latch has two inputs, a set input S and a reset input R. If the S input is at a HIGH logic level while the reset input is at a LOW logic level, the output of the latch, commonly known as Q, will attain a high logic level. If the S input is at a low logic level and the R input is at a high logic level, the output Q will attain a low logic level. If both the R and S inputs are at a high logic level, Q will remain in the same state as it was immediately before, when only one of the inputs was high. Typically, an RS latch is constructed from cross-coupled NAND or NOR gates.

The two input signals to the circuit of FIG. 2, $F_{IN}$, $F_{BK}$ are respectively connected to first inputs of two NAND gates 10, 11. The outputs of gates 10, 11 are respectively connected to the reset inputs R of two RS latches 12, 13, respectively, and to two delay lines 14, 15, respectively. The outputs of gates 10, 11 are each further connected to one input of a four-input NAND gate, 20. The remaining two inputs of the four-input NAND gate are each connected to one output $Q_{RS}$ of the RS latches 12, 13. The output of the four-input NAND gate is connected to both set inputs S of the two RS latches 12, 13. This output is further connected to one input of each of two three-input NAND gates 16, 17, each of which has one of its other two inputs connected to the outputs of one of the delay lines 14, 15 respectively. The remaining inputs of gates 16, 17 are each connected to the output of the corresponding RS latch 12, 13. The outputs of the two three-input NAND gates 16, 17 are connected to the second input of the associated two-input NAND gates 10, 11 and are each further connected to an inverter 18, 19 whose outputs supply the output signals UP, DN of the phase detector.

FIGS. 2A to 2F can be used to explain the functionality of an RS latch phase detector such as that shown in FIG. 2. In these figures, a thick signal line is used to represent a high logic state, a thin line to represent a low logic state, and a dotted line indicates a logic state on the point of changing.

FIG. 2A shows the initial states of the various signal lines. The outputs UP, DN are LOW in their inactive states. Hence, the inputs to inverters 18, 19 are normally HIGH. In this state the NAND gates 10, 11 function merely as inverters of the input signals $F_{IN}$, $F_{BK}$, respectively. A falling edge arriving on the $F_{IN}$ signal will cause the output of gate 10 to switch.

In FIG. 2B, the falling edge arriving on the $F_{IN}$ signal is propagated by the delay line to switch the output UP to HIGH. The R input to RS flip-flop 12 is taken HIGH, but no change to its output $Q_{RS}$ takes place, as the S input is also HIGH. Similarly, an input to the NAND gate 20 is taken HIGH, but its output remains HIGH due to the LOW input from gate 11. However, the feedback signal from gate 16 to gate 10 changes to LOW.

Referring to FIG. 2C, when a falling edge arrives on the $F_{BK}$ input signal, as before, the R input of the associated flip-flop 13 is taken HIGH, but its output $Q_{RS}$ remains HIGH due to the HIGH level maintained on its S input; also the associated input to the NAND gate 20 is taken high. The output of this NAND gate will now change state.

The effects are shown in FIG. 2D; the LOW output of the gate 20 causes the S input of both flip-flops 12, 13 to go LOW, so their outputs $Q_{RS}$ will each be forced LOW by the HIGH on each R input. These are connected to gates 16, 17. Gate 16 changes state so that its output, UP,—and the feedback signal to gate 10—returns to a HIGH state. The delay line 15 is so designed that the change in state of the output of gate 20 reaches the gate 17 at the same time as the change in the output of gate 11. In this manner, gate 17 does not change state, as at least one output is always at a LOW level and no changes appear at the output DN.

In FIG. 2E, the LOW outputs $Q_{RS}$ cause the gate 20 to change state, placing the S inputs of the flip-flops 12, 13 in a HIGH state, as well as one input to each gate 16, 17.

As in FIG. 2F, when a rising edge arrives on $F_{IN}$, the R input of flip-flop 12 is taken LOW, causing its output $Q_{RS}$ to go HIGH. Delay line 14, having been designed to have the same delay time as the propagation delay of the RS latch, should avoid the situation where all three inputs of gate 16 are HIGH during the transition, as the HIGH from $Q_{RS}$ should reach gate 16 at the same time as the LOW from delay line 14 so no change occurs at the output UP. A small 'parasitic' pulse my be produced at the output of gate 16 during this transition. Such a parasitic pulse would be of a very short duration, and would effectively be filtered out by the charge pump or differential amplifier. These circuits need a minimum switching time to be activated, which would be longer than the width of the parasitic pulse. The low pass filter will additionally ensure that no effect of a parasitic pulse would reach the controlled oscillator. Similarly, no change in output occurs at DN when a rising edge occurs on the $F_{BK}$ input. This returns the circuit to the state shown in FIG. 2A. Therefore, if the $F_{IN}$ input signal phase leads the $F_{BK}$ input signal, pulses occur on the UP output equal in width to the phase difference between the two signals; no pulses occur on the DN output. From symmetry, pulses will occur on the DN output for the case where the $F_{BK}$ input signal phase leads the $F_{IN}$ input signal, with the UP output remaining LOW.

This design uses one four input NAND gate, and two three input NAND gates. Such gates with large numbers of inputs are very slow in operation when fabricaied with CMOS technology, particularly when used with relatively low supply voltages, such as 5V or 3.3V.

In many CMOS circuits, speed of operation is limited by the current handling capabilities of the transistors used. In such circuits, the speed may be increased by increasing the channel widths of the appropriate transistors. However, the circuit of FIG. 2 is limited in its speed of operation by the threshold voltages and associated capacitances of transistors used. Although the speed of operation of the circuit of FIG. 2 could be increased to some extent by increasing the sizes of the transistors, a limit to the possible speed increase is reached due to the associated capacitances, which also increase with transistor size.

Each transistor in an integrated circuit has several capacitances associated with it. Most obviously, there is the gate capacitance, which is charged and discharged by the application of required gate voltages. Also, there are several parasitic capacitances. These are, for example, junction and depletion layer capacitances at the junctions between source, drain and channel regions of a given transistor and the bulk silicon. During a switching operation, these capacitances have to be charged or discharged, which slows down the switching operation. When several transistors are placed in series, as is the case for four-input NAND gates, and when all need to be switched at the same time, several capacitances will need to be charged concurrently, and this greatly slows the switching of the circuit.

In the case of the RS-latch-based phase detector of FIG. 2, the four-input NAND gate is constructed from four series-connected N-channel transistors connected between a ground voltage and a parallel arrangement of four P-channel transistors, itself connected to a supply voltage. The gate of each P-channel transistor is connected to the gate of a different N-channel transistor, each of these connections being an input to the NAND gate, the output being taken from a node between the P-channel transistors and the N-channel transistor connected to them.

The capacitances associated with each transistor may be considered as a capacitance at each node between the series connected transistors. In addition, the capacitance due to circuitry connected to the output of the gate may be considered as a further capacitance connected to the output of the gate. When all four inputs to the gate are high, all the capacitances associated with the transistors must be discharged to ground potential. Depending on the previous states of the inputs, some or all of the associated capacitances may be charged to the supply potential. These must be discharged before a low output can be obtained from the gate. This discharging introduces a delay between application of the fourth high input and the attainment of a low output.

Delay lines 14 and 15 are introduced into the circuit to ensure correct timing of the internal signals. These delay lines prevent use at high frequencies and are themselves subject to large variations in effective delay time, caused by normal process variations. For this reason, their operation is unpredictable. Such delay lines and multiple input gates present problems particularly at the design stage, where care must be taken to match the delay times in various parts of the circuit, taking account of process variations and temperature dependency of the devices used. For example, the four-input NAND gate must always have a propagation delay less than that of the delay lines, irrespective of temperature or process variation.

Moreover, the RS latch based detectors are not suitable for use at supply voltages below 5V, as the charging and discharging of the inherent parasitic capacitances takes too long at lower supply voltages, as the gate-source voltages of the transistors are then lower so that these transistors are less conductive when on.

There is a current trend towards using supply voltages of 3.3V or lower, for power consumption improvement in all domains of integrated circuit technology. This is too low a voltage to supply five transistors in series and leads to slow charging and discharging of associated capacitance, leading to slower operation.

FIG. 3 represents a second type of known phase detector, using D-type latches. A D-type latch transfers a logic level at an input D to the output $Q_D$ and the inverse thereof to an output $\overline{Q}_D$, when a falling edge is received on a clock input CP. In the figure, two D-type latches 22, 23 each have their input terminal D connected to a high supply voltage $V_{CC}$ 21 and hence are held at a HIGH logic level. The two input signals to the phase detector, $F_{IN}$, $F_{BK}$, are connected to the clock inputs CP of the two D-type latches 22, 23. The outputs $Q_D$ of the two D-type latches 22, 23 respectively constitute the outputs UP, DN of the phase detector. The logic HIGH at the input of each of the D-type latches 22, 23 is transferred to the respective latch output $Q_D$ when falling edges of the respective input signals $F_{IN}$ and $F_{BK}$ are received. The phase leading signal will cause its associated output to go HIGH first. The end of the phase difference period is indicated by the second output going HIGH. This causes two low ($\overline{Q}_D$ from each latch) inputs to be supplied to a NOR gate 24 and an active LOW signal will result at the 'clear' inputs CLR of both D-type latches, via inverter 25, clearing both latches, and returning both UP and DN outputs to their inactive (LOW) state. The use of inverter 25 ensures sufficient delay for the D-type latches to attain a stable state before being reset, hence assuring a 'clear' signal at CLR of sufficient duration to ensure reliable clearing of the latches 22, 23.

With this circuit, pulses will be present on both outputs, UP and DN, one indicating the width of the phase error (phase lead by the $F_{BK}$ signal if such pulses appear on the DN output, phase lag by the $F_{BK}$ signal if such pulses appear on the UP output), plus a reset delay, being the time taken for the NOR gate 24 and the inverter 25 to provide a reset pulse on the inputs CLR of the D-type latches 22 and 23 and for the latches to respond to such applied reset signal; the other of the two outputs will supply narrow pulses, the duration of which is equal to the reset delay described above.

FIG. 4 shows the conventional embodiment of a D-type latch, which is, in fact, a master-slave flip-flop. In this example, RS flip-flops are used. Two clocked RS flip-flops 27, 28 are cascaded to form a D-type latch. The clock input CP is connected to a clock input of RS flip-flop 27, and is further connected to the input of an inverter. The output of this inverter is connected to the clock input of RS flip-flop 28. The input D is connected to the S input of RS flip-flop 27, and is also connected to the input of a second inverter whose output is connected to the R input of RS flip-flop 27. The outputs of RS flip-flop 27 are connected to respective inputs S, R of RS flip-flop 28 whose outputs $Q_S$, $\overline{Q}_S$ are the non-inverting and inverting outputs of the D-type latch, respectively.

Flip-flop 27 represents the 'master' flip-flop (or RS latch), and 28 represents the 'slave' flip-flop. The clock of the slave flip-flop is inverted with respect to that of the master flip-flop. The data present on the input D is transferred to the output of the master flip-flop at the high level of a clock signal cycle, and transferred to the outputs $Q_S$ and $\overline{Q}_S$ by the slave flip-flop on the following low level. Hence, two clock levels are required to transfer data through such a D-type latch.

Each of the master and slave flip-flops of the D-type latch require a minimum time for the propagation of data. Each flip-flop is activated by a different logic state of the waveform supplied to clock input CP, so that the D-type latch circuit requires a minimum duration of both the high and low states of the input signals $F_{IN}$, $F_{BK}$. The high frequency limit is therefore reached when each part of the input cycle has a duration equal to this minimum. A 50% duty cycle is therefore required to obtain highest possible frequency operation. For any other duty cycle ratio, the shortest of the high and low portions needs to be equal to the minimum duration described, and so only a lower frequency operation may be achieved.

Such D-type latch phase detectors have a slow response time due to their need to use two clock edges. The phase error signal only reaches the output of the detector as the next cycle begins. Such a D-type latch embodiment also consumes a large amount of power, due to the large number of transistors required—around 32. To optimise a D-type phase detector for operation at 150 to 200 MHz, adjustments to the delay times in each D-type latch would need to be made, necessitating a large number of expensive transistor-level adjustments. As D-type latch phase detectors have a maximum of only three transistors in series, it is possible to use them at 3.3V, but their frequency response would be much reduced and all transistors would need to be individually optimised for any particular application.

All phase detectors, of whatever design, are intended to produce an output signal proportional in magnitude or duty cycle to the phase difference between their two input signals. However, despite optimised designs, there always exists a 'dead zone' around the zero phase error position. Very small phase errors are not detected, and no change in output of the phase detector occurs for variation in phase within this dead zone. Such variations are therefore uncontrollable and may lead to jitter in the output frequency of the PLL.

FIG. 5 illustrates the concept of the 'dead zone' of a phase detector. This is an important parameter for phase detection circuits, and represents the maximum phase error between the two input signals which can exist without the phase detector producing any output. The $\phi$ axis represents the phase difference between the two input signals and the $\delta V_C$ axis represents the resulting change in the control voltage to the controlled oscillator. The dead zone 30 is the area in which no output is produced by the phase detector, and hence no control is exercised over the controlled oscillator within this range. This causes 'jitter'. In a well designed phase locked loop, dead zones equivalent to picosecond time intervals may be achieved. The slopes of the curves at 31, 32 represent the ratio of control voltage applied to the oscillator to the phase error of the input signals. This ratio is a parameter affecting the speed of response of a phase locked loop to a change in input phase or frequency. In known phase detectors, the cross-coupled gates used in the flip-flops make the dead zone hard to control, due to the delay caused by cross-coupled gates. A pair of cross-coupled gates, apparently in parallel will however require twice the propagation delay of a single gate before reaching a stable state, as the output of one is effectively in series with the input of the other.

Were the dead zone reduced, circuits using the same reference clock could be more closely synchronised.

Accordingly, an object of the present invention is to provide a phase detector with improved operation at low supply voltages.

A further object of the invention is to provide such a phase detector which is of simple structure, which directly leads to reduced power consumption and semiconductor surface area.

A further object of the invention is to provide such a phase detector with a reduced dead zone.

SUMMARY OF THE INVENTION

These objects are achieved by a circuit for detecting the difference in phase or frequency between two incoming signals and producing digital output signals according to the degree of phase lead or phase lag of one signal over the other. This circuit includes first sub-circuits connected, one to each of the said input signals, producing an output pulse of short duration compared to the period of the incoming signal at one of the rising and falling transitions of the input signal. Two resettable pulse detection circuits each have an output set to a first stable state when an active signal is received on its reset input and changing to a second stable state when a short duration pulse is received from a respective one of the subcircuits on a pulse input. Further circuitry is connected such that when both outputs of the resettable pulse detection circuits are in the second stable state, an active reset signal is supplied to both resettable pulse detection circuits, to return both of their outputs to the first stable state. The outputs of the resettable pulse detection circuits are the outputs of the circuit.

According to an embodiment of the invention, each of the resettable pulse detectors comprises a first, second and third transistors of first, first and second channel types respectively, connected successively in series between first and second supply voltages, the control electrodes of the first and third transistors forming the reset input and the control electrode of the second transistor forming the pulse input. An inverting latch is also provided for latching the state of the node between the first and third transistors and the inverse of this state at the output of the resettable pulse detection circuit.

According to another embodiment of the invention, the sub-circuits each include one NAND gate with an odd number of inverters connected in series between two inputs of each of the NAND gates, the input to each sub-circuit being applied to the input of the respective series arrangement of inverters and to one of the inputs of the respective NAND gate.

According to another embodiment of the invention, further circuitry is added to ensure that only one of the two outputs is active at any one time. The further circuitry includes a first and a second NOR gate each connected so as to receive on its first input one of the outputs of the circuit, and each further connected to receive on its second input the inverse of the other of the outputs of the circuit.

BRIEF DESCRIPTION OF THE DRAWINGS

One method of carrying out the invention is described below with reference to drawings which are given by way of example only, in which.

DETAILED DESCRIPTION OF THE INVENTION

The present invention provides a phase detector having the same function as the D-type latch phase detector described above, but using a much simpler circuit which does not introduce the frequency response limitation caused by the need to use two clock edges for propagation, avoids the dependency of frequency response on duty cycle, uses less power and offers a 30% reduction in silicon area over the D-type latch circuit. A faster response time to a change in input phase is assured by a one-cycle response time, and the dead zone is reduced.

Figure 1:
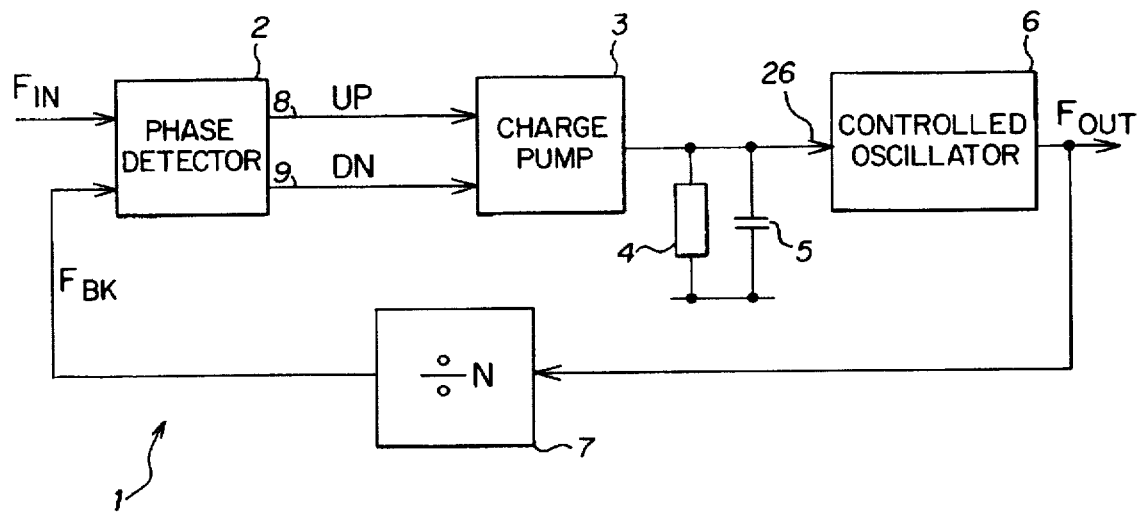
FIG. 1 is a schematic diagram of a conventional phase locked loop circuit.
Figure 2:
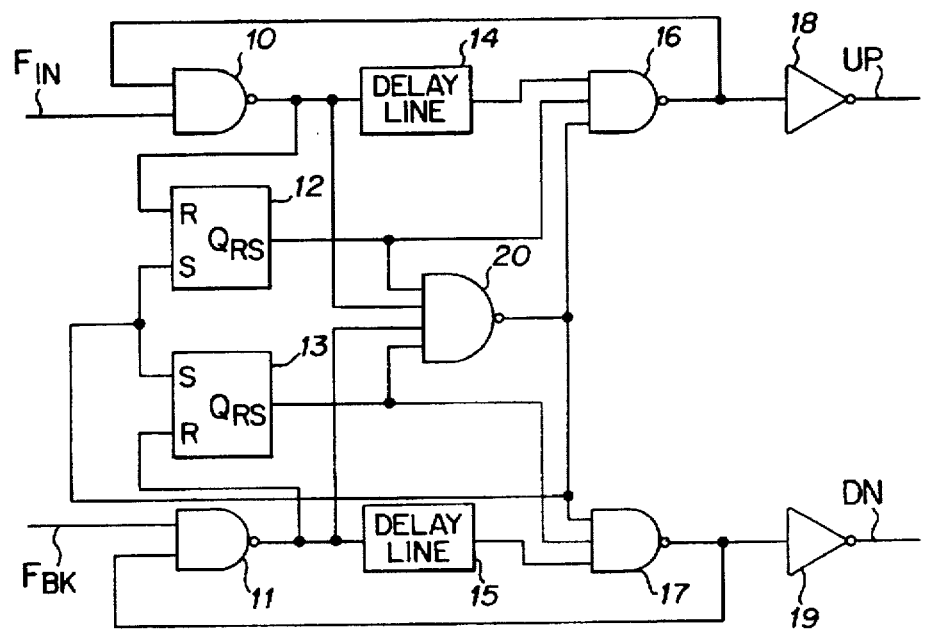
FIG. 2 is a circuit diagram of a conventional phase detector, using RS latches.
Figure 2A:
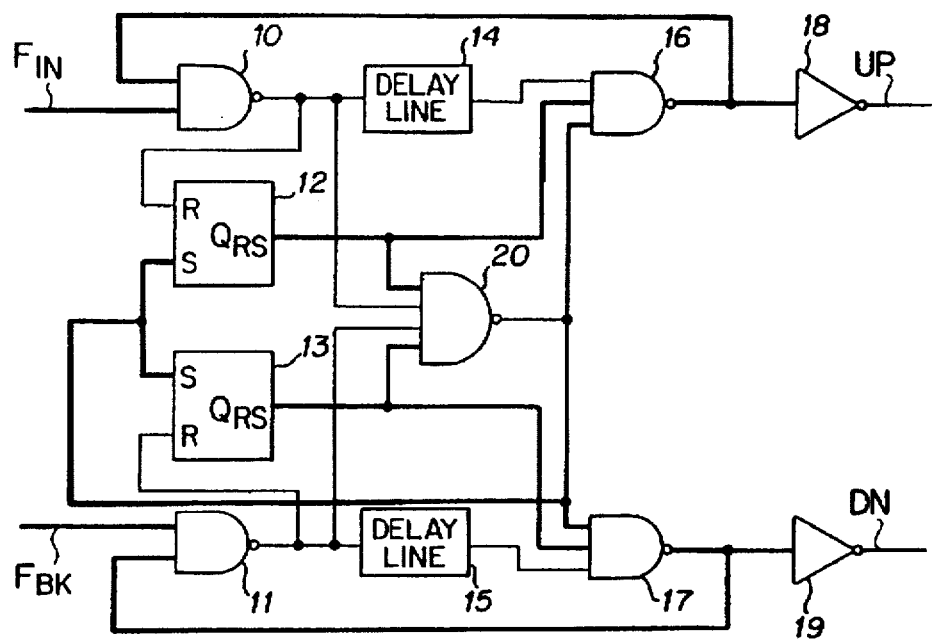
FIGS. 2A to 2F show the circuit of FIG. 2 in various states during its operation.
Figure 2B:
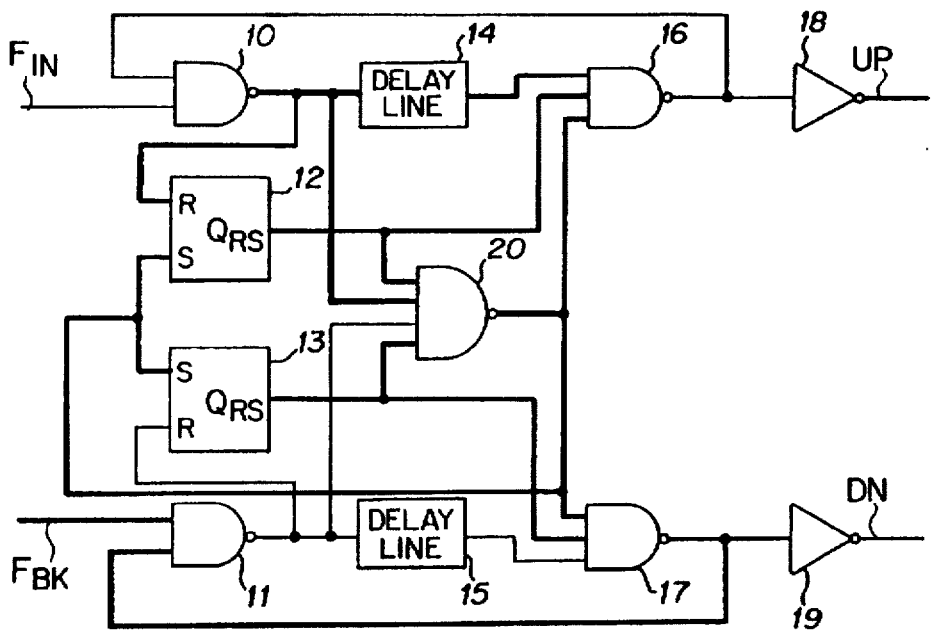
Figure 2C:
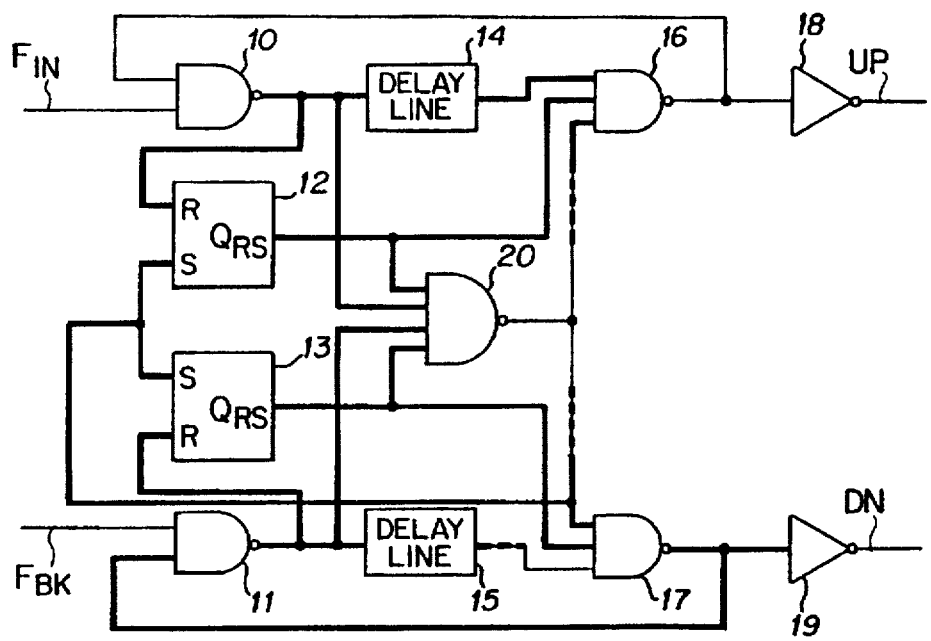
Figure 2D:
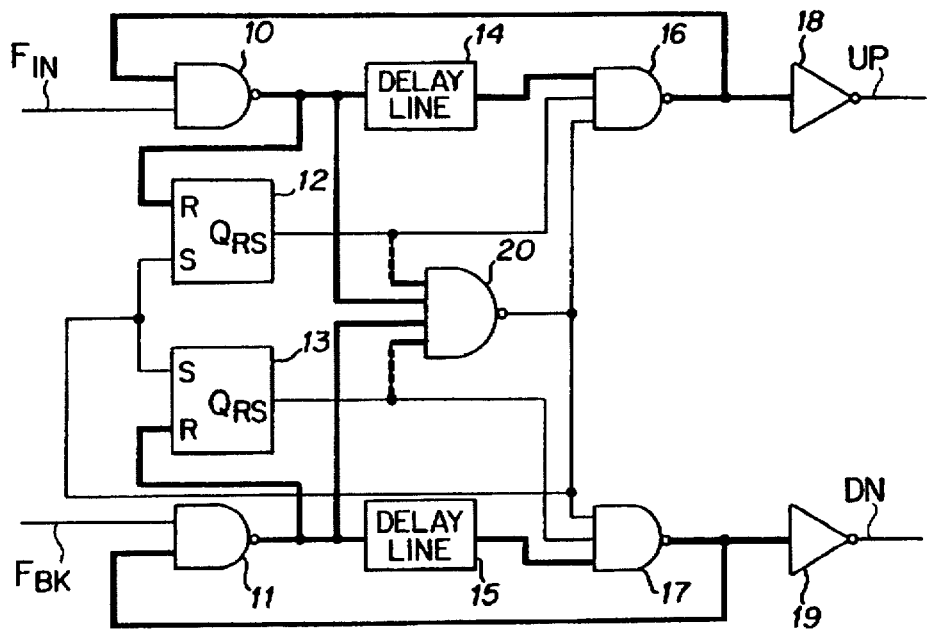
Figure 2E:
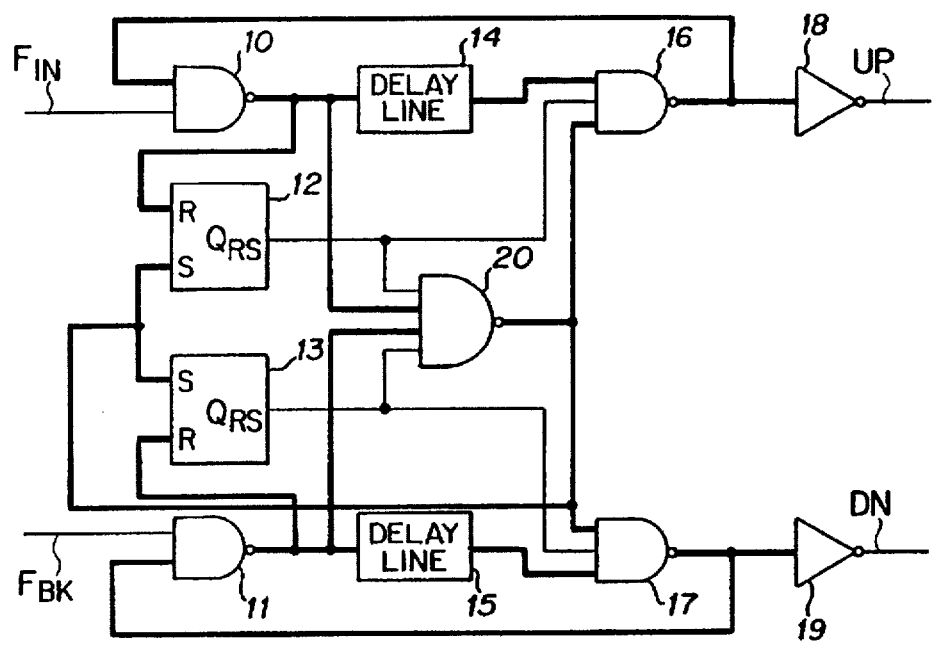
Figure 2F:
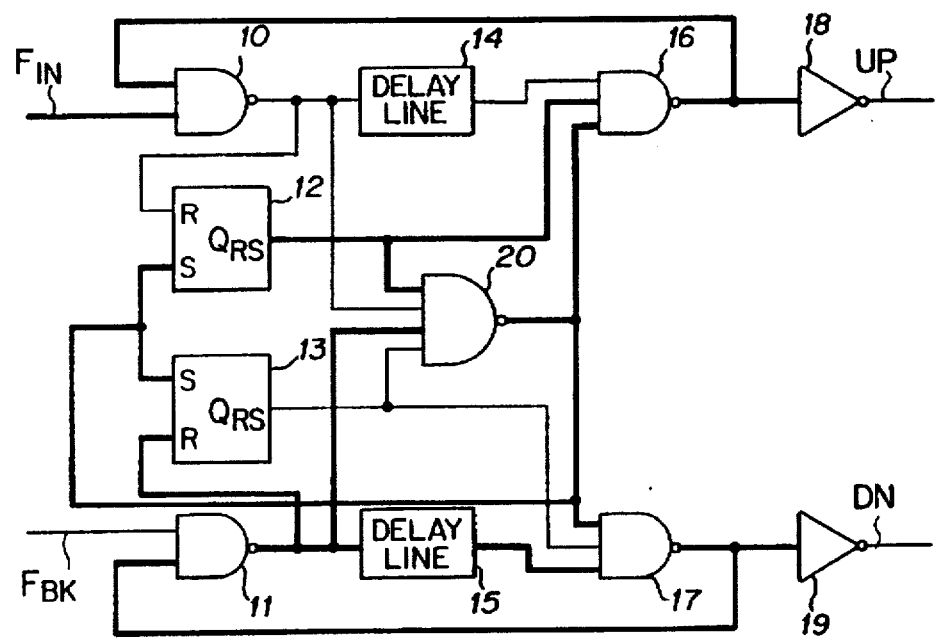
Figure 3:
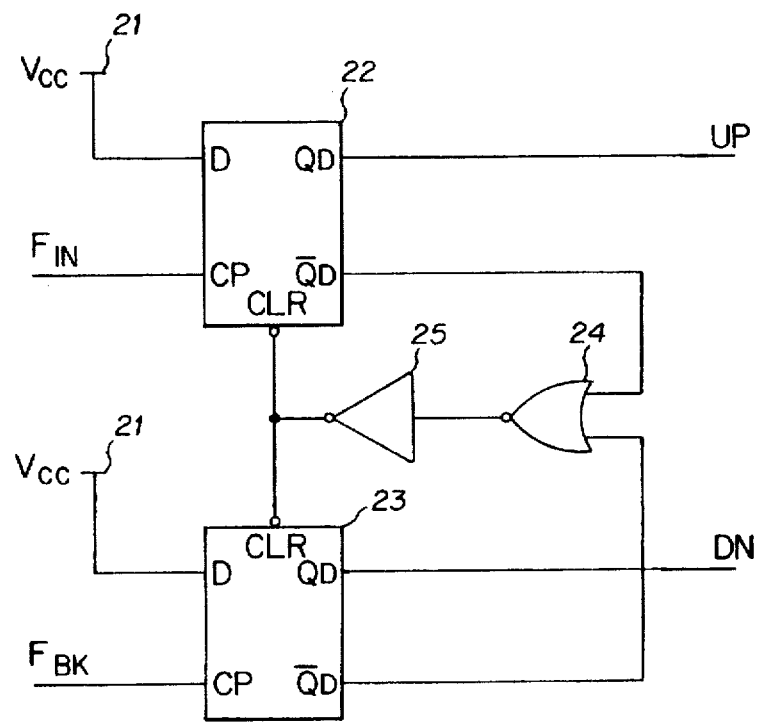
FIG. 3 is a circuit diagram of another conventional phase detector, using D-type latches.
Figure 4:
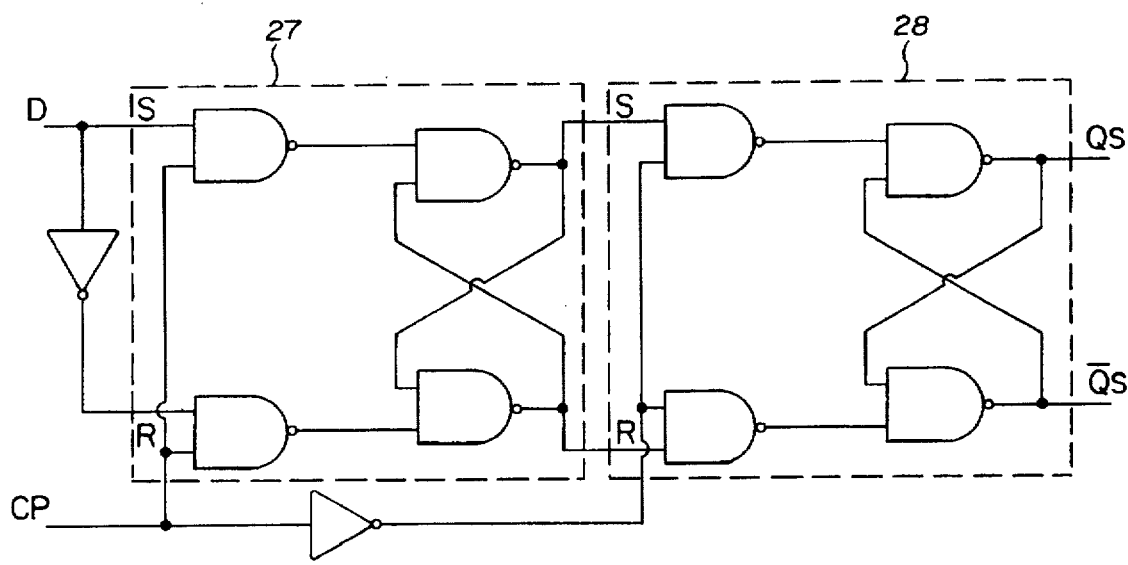
FIG. 4 is a schematic diagram of a D-type latch, as used in the phase detector of FIG. 3.
Figure 5:
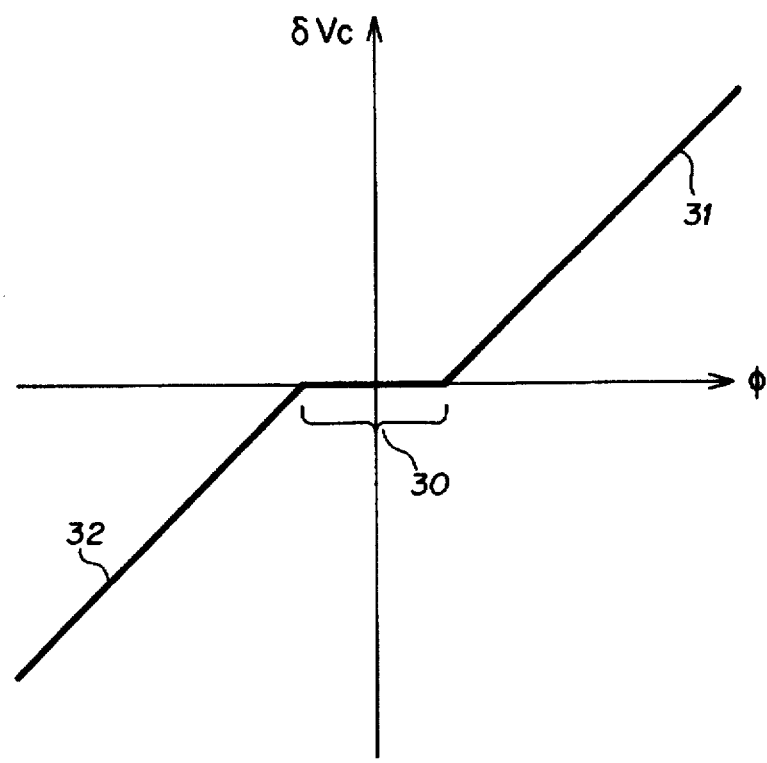
FIG. 5 represents the relationship between phase error and control voltage supplied to a controlled oscillator in a conventional phase locked loop circuit.
Figure 6:
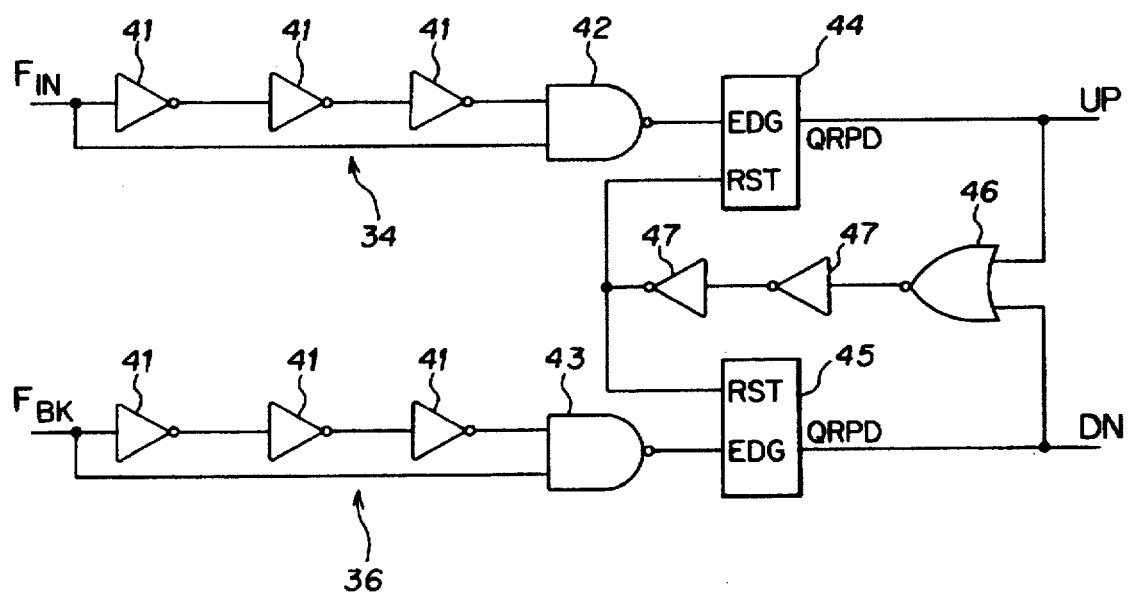
FIG. 6 is a schematic diagram of an embodiment of a phase detector according to the present invention.

In FIG. 6, according to the present invention, the input signals $F_{IN}, F_{BK}$, are both connected to one of respective edge detectors 34, 36, each composed of one NAND gate 42, 43 and an odd number of inverters 41 connected in series between the inputs of each NAND gate. Each input signal $F_{IN}, F_{BK}$ is applied to the input of the respective series arrangement of inverters 41, and so also directly to an input of the respective NAND gate. The edge detectors serve to produce a short, active LOW pulse on the output of gates 42, 43 respectively on each rising edge of the respective input signals, $F_{IN}$ or $F_{BK}$, due to the delay imparted by the series arrangement of inverters 41. The output of each such edge detector is connected to an input EDG of a resettable pulse detector 44, 45, the outputs $Q_{RPD}$ of these pulse detectors forming the outputs of the phase detector UP, DN.

These resettable pulse detector subcircuits function so as to be forced into one stable state when an active-HIGH 'Reset' pulse is applied to the RST input, the output $Q_{RPD}$ attaining a first stable state. The sub-circuit changes state upon the application of an active-LOW pulse such as described above, to its input EDG causing its output $Q_{RPD}$ to attain a second stable state.

The outputs $Q_{RPD}$ are each connected to an input of a two input NOR gate 46 which supplies an active-HIGH reset pulse when both outputs UP, DN are LOW to the RST input of the resettable pulse detector circuits 44, 45 through two inverters 47, which serve to ensure a propagation delay of the reset pulse sufficient for the outputs of the resettable pulse detectors 44, 45 to attain a stable state before being reset. This is important for reliable reset action and also improves the dead zone of the phase detector, as described hereinafter.

Figure 7:
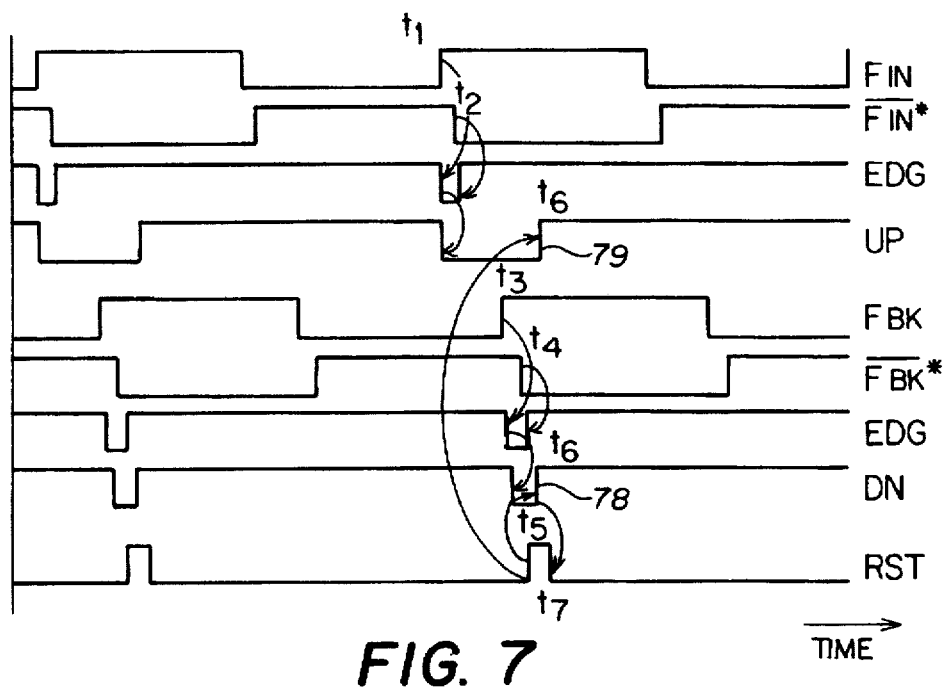
FIG. 7 is a timing diagram showing various signals occurring within a phase detector of the invention, during operation.

With reference to the timing diagrams of FIG. 7, showing signals within the circuit of FIG. 6 when used as a phase detector, suppose a rising edge first appears on the first input signal $F_{IN}$ of the circuit at time $t_1$. An active LOW pulse will be supplied to the input EDG of the resettable pulse detector 44 between time $t_1$ and time $t_2$ due to NAND gate 42 being supplied with a rising edge of $F_{IN}$ at time $t_1$ and with its delayed inverse, $\overline{F}^*_{IN}$, at time $t_2$. The output $Q_{RPD}$ of pulse detector 44 will go LOW and so the UP output of the circuit will go LOW. When the second input signal $F_{BK}$ goes HIGH at time $t_3$, a similar sequence of events causes the DN output of the circuit to go LOW when a LOW pulse is supplied at time $t_3$ to the input EDG of resettable pulse detector 45 by NAND gate 43, which is supplied with a rising edge of input $F_{BK}$ at time $t_3$ and with its delayed inverse $\overline{F}^*_{BK}$ at time $t_4$. The NOR gate 46 receives both of these LOW signals on UP and DN and its own output goes HIGH, providing a reset signal at time $t_5$ to the two resettable pulse detectors 44, 45 via the inverters 47. A delay is thus introduced between the time that the output DN goes low and the time that the two resettable pulse detectors 44, 45 are reset, returning the outputs UP, DN to the HIGH state. This reset delay is the total of the propagation delays of the NOR gate 46, the inverters 47, and the resettable pulse detector 45. Bothe The UP and DN outputs then return to the HIGH state at the end of the reset delay, time $t_6$, causing the reset pulse to terminate at time $t_7$.

Supposing that the two input signals of the phase detector $F_{IN}$, $F_{BK}$ are in phase, pulses of width equal to the reset delay described hereinbefore will be produced on both the UP and DN outputs. As soon as a very small amount of phase error is introduced, one pulse will become wider than the other, and the difference in pulse width will be equal to the phase error. Such difference in width is equivalent to a full magnitude pulse for the duration of the phase error.

If the reset delay were eliminated, no pulses would be produced when both signals were exactly in phase. If a small amount of phase error were to occur, the output gates would produce very narrow pulses, corresponding to small phase errors. Since the output signals UP, DN have limited rise and fall times, the narrow output pulses would not achieve their full magnitude, and would not be recognised by the differential amplifier or charge pump, 3. This would cause ineffective phase error detection and hence reduced control over small phase errors. This corresponds to increased dead zone. This is explained with reference to FIGS. 7A–7D.

Figure 7A:
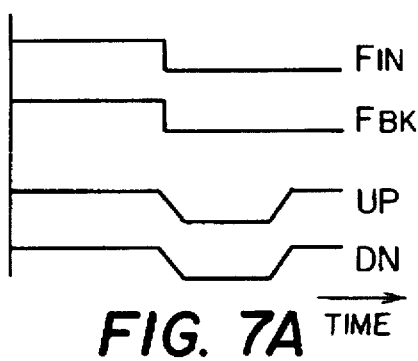
FIGS. 7A–7D show input and output signals of phase detectors both of known type and according to the invention, with input signals both in phase and with a very small phase error.

Referring to FIG. 7A, the phase detector according to the invention provides pulses of equal width on both the UP and DN outputs when the two input signals $F_{IN}$, $F_{BK}$ are exactly in phase. These output pulses commence at the rising edges of the input signals $F_{IN}$, $F_{BK}$ and end after the reset delay period.

Figure 7C:
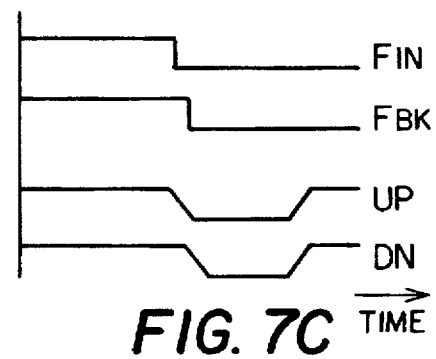
Figure 7B:
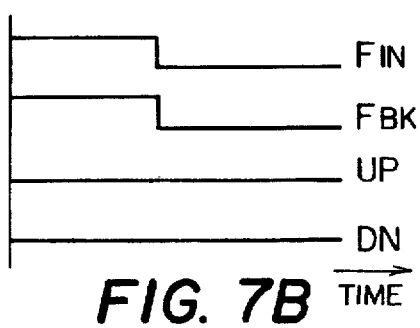

FIG. 7B shows output signals of a conventional phase detector for the case in which both input signals $F_{IN}$, $F_{BK}$ are exactly in phase. No pulses are produced on either output.

FIG. 7C shows the outputs of a phase detector according to the invention when a small phase error is introduced between the two signals. The UP output now produces pulses wider than those of the DN output, the difference in width being equal to the phase error. The difference between these two signals, interpreted by a charge pump, is equivalent to a pulse of full height and of width equal to the full duration of the phase error. Control is thus exercised over the oscillator.

Figure 7D:
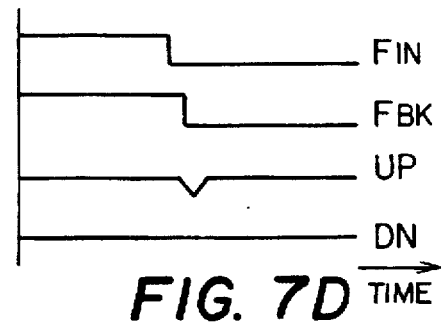

FIG. 7D illustrates output signals for the conventional phase detector with input signals identical to those shown in FIG. 7C. With a small phase difference, the output gates producing the UP pulses have fall times longer than the phase error. The pulse on the UP output does not have time to reach its full height before the pulse ends. The difference between the UP and DN signals is insufficient to be detected by the charge pump, and no control is exercised over the oscillator.

The improved control offered by the invention over small phase errors corresponds to a reduced dead zone.

Figure 8:
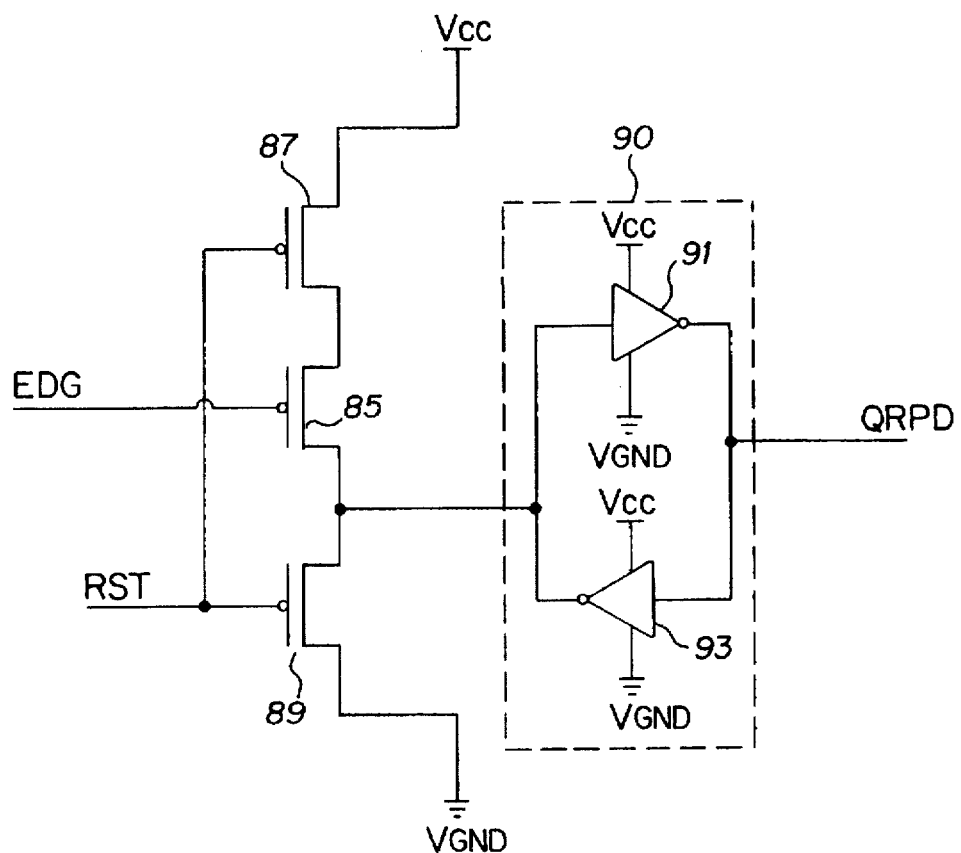
FIG. 8 is a circuit diagram of an embodiment of a resettable pulse detector circuit according to the present invention.

FIG. 8 shows an embodiment of a resettable pulse detector according to the invention. The input EDG of to the resettable pulse detector, is connected to the gate of a P-channel MOS transistor 85. This transistor 85 is connected in series between another P-channel MOS transistor 87 and an N-channel MOS transistor 89. The source of N-channel MOS transistor 89 is further connected to ground potential $V_{GND}$, whereas the source of P-channel MOS transistor 87 is connected to the supply potential $V_{cc}$. The drain terminals of transistors 85, 89 are connected together, providing a drive signal, and are further connected to an inverting output latch 90 consisting of logic inverters 91,93 connected in inverse parallel and to supply and ground potentials $V_{cc}$, $V_{GND}$. Inverter 93 includes output transistors of low current drive capability. This is necessary so that the logic level at the input to latch 90 can easily be switched by transistors 87, 85, 89 without the inverter 93 holding that input at its previous value. The output of the inverting latch 90 constitutes the output $Q_{RPD}$ of the resettable pulse detector circuit. The reset signal line RST is connected to the gates of both transistors 87, 89.

To explain the functioning of this circuit, the circuit is taken as being in its reset state, just after the application of a reset pulse, such that a high state in the RST input will force a LOW onto the input of the latch, by turning off the supply voltage $V_{CC}$ to the series arrangement of transistors 85, 89 and connecting the latch input to the ground potential $V_{GND}$ via transistor 89. The input of the inverting latch 90 is at a LOW level, the output $Q_{PFD}$ of the latch at HIGH level. As soon as the reset signal RST becomes inactive (LOW), N-channel transistor 89 is turned off, disconnecting the input of the inverting latch 90 from ground potential, and P-channel transistor 87 is turned ON, connecting the source of transistor 85 to the supply potential $V_{CC}$.

The input EDG is the output of the edge detectors described above. This input is normally HIGH, holding P-channel transistor 85 OFF. In this case, both transistors 85 and 89 are OFF, and the input of the inverting latch 90 is not forced to either supply or ground potential. It remains stable in the last state it was forced to. When an active LOW pulse arrives on the input EDG, transistor 85 is turned ON and the input of the inverting latch 90 is forced HIGH by transistor 85 and by transistor 87 which is held ON by the inactive (LOW) level of the reset line RST.

The HIGH level forced onto the input to the inverting latch 90 causes its output, and hence the output of the circuit $Q_{PFD}$ to go LOW. The inverting latch retains this state once the active low pulse on EDG has passed. Once the pulse has terminated and the input returns to its normal (HIGH) state, the input to the inverting latch 90 is neither connected to the HIGH nor the LOW voltage by transistors 89, 85, and so will remain at the HIGH level retained by the inverting latch 90.

Should any further pulses appear on the input EDG, no change will occur to the circuit. The output $Q_{RPD}$ will remain LOW, until an active HIGH reset signal is received at RST.

In such a circuit, under worst case conditions, only two transistors, connected in series with each other, are ever switched at the same time. This improves circuit response speed, and hence maximum operating frequency, as at most only two transistors' associated capacitances need to be simultaneously charged or discharged.

It will be seen that a phase detector such as described above is responsive to one edge only of the input signals, and is therefore independent of the input waveforms' duty cycles. High speed operation of this circuit is made possible, as the operating speed is limited by the duration of the resetting pulse, which may be made very short. Operation at frequencies above 300 MHz has been observed. The design is very simple, using a minimum number of transistors; it is easy to optimise for high frequency operation as the minimum input pulse width, which determines the high frequency operation of the phase detector 13 is set by one transistor 85 and the settling time of latch 90. Moreover, due to its simplicity, particularly regarding the reduced number of series connected transistors, the invention is directly suitable for operation at low supply voltages. The circuit has been tested at a supply voltage of 2.5V.

The simplicity of the circuit leads to a saving of 30% of semiconductor area when compared to a conventional D-type latch phase detector. This reduction in size and complexity in addition to the reduced charging requirements of parasitic capacitances leads to a significant reduction in power consumption.

As shown in FIG. 7, in the phase detector described hereto, pulses are produced on both UP and DN outputs. One of the outputs consist of wide pulses 79 representing the phase error plus one reset delay, the other output will be of pulses representing one reset delay only 78.

This circuit has the best dead zone response but increases the possibility of the transmission of noise on the power supply towards the controlled oscillator. When the UP output is LOW, the charge pump 3 connects an internal capacitor to the supply voltage $V_{CC}$, so any noise present on $V_{CC}$ due to the operation of associated digital circuits, for example, will be transmitted to the outputs of the charge pump. As the latch 90 produces a LOW pulse on the UP output once per cycle of the input signals, there is connection between the power supply and the charge pump capacitor once per cycle of input frequency, for theduration of the LOW pulses of the phase detector. In a typical PLL circuit, this noise will be filtered out by the loop filter 4, 5 before reaching the control terminal of the oscillator 6.

Figure 9:
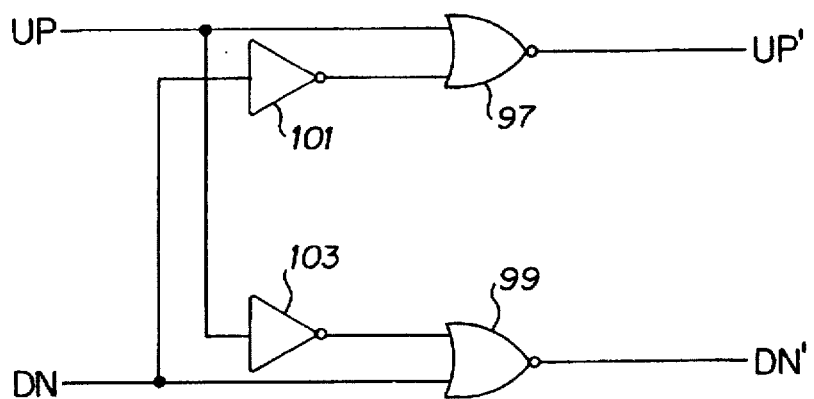
FIG. 9 is a circuit of another embodiment of a phase detector according to the present invention.

The circuitry of FIG. 9 may optionally be added to the outputs UP and DN of FIG. 6, so that an output will occur on only one of outputs UP', DN' at any one time. The output pulses then have a duration equal to the phase error plus one inverter delay. The pulses due to the reset delay are eliminated. The possibility of transmission of noise on the power supply towards the controlled oscillator is reduced, as LOW pulses on the UP output are only produced when the second input signal $F_{BK}$ lags the first input signal $F_{IN}$. The circuitry of FIG. 9 may also be referred to as masking circuitry that generates a pair of output signals that are active only one at a time.

The outputs of the phase detector of FIG. 6, UP, DN are each connected to a first input of a respective two-input NOR gate 97, 99, a second input of which is connected to the other output UP, DN of the phase detector by means of a respective inverter 101,103.

Figure 10A:
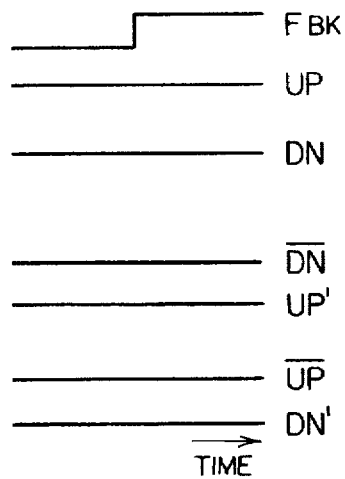
FIG. 10A is a timing diagram representing input and output signals of a phase detector according to the invention, when the input signals are in phase.

With reference to the timing diagrams of FIG. 10A, when both input signals $F_{IN}$, $F_{BK}$ are in phase, a falling edge on the UP signal is coincident with a falling edge on the DN signal. Similarly, the corresponding rising edges on the inverted signals $\overline{UP}$, $\overline{DN}$ are coincident, but occur one inverter delay later. Both of the NOR gates 97, 99 therefore receive a falling edge on their first input at the same time and a rising edge on their second input one inverter delay later. During this inverter delay period, the gates 97, 99 are logically in a HIGH state, as both inputs are LOW. However, due to the rise and fall times of the outputs of gates such as 97, 99, the change in output does not have enough time to reach a significant magnitude before the inputs to respective second inputs change state. Hence small pulses may be produced on the outputs UP', DN' of the gates 97, 99. These do not reach full height and are not recognised by subsequent logic or filter circuitry. In phase lock, therefore, no output pulses are produced by either of the gates 97, 99.

Figure 10B:
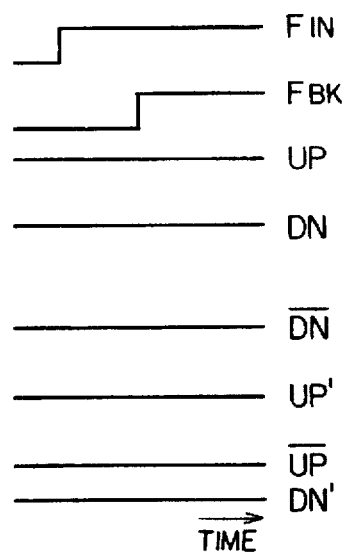
FIG. 10B is a timing diagram representing input and output signals of a phase detector according to the invention, when the second input signal phase lags the first input signal.

Referring to FIG. 10B, as soon as a small degree of phase error is detected, with $F_{BK}$ lagging $F_{IN}$, a falling edge is received on the UP signal by gate 97 before a falling edge is received on the DN signal by the other gate 99. A pulse is produced on the output signal UP' of gate 97 from the moment the falling edge on UP is received until the rising edge of $\overline{DN}$ is received, one inverter delay after the falling edge of the DN signal. The inverter delay introduces a widening of the pulse equivalent to the narrowing of the pulse due to the rise time requirement of the NOR gate 97. The output pulse on UP' is then of the same duration as the difference between the UP and DN signals, being the period of phase error. No pulses are produced on the DN' output, as NOR gate 99 never receives both inputs at a LOW level.

Figure 10C:
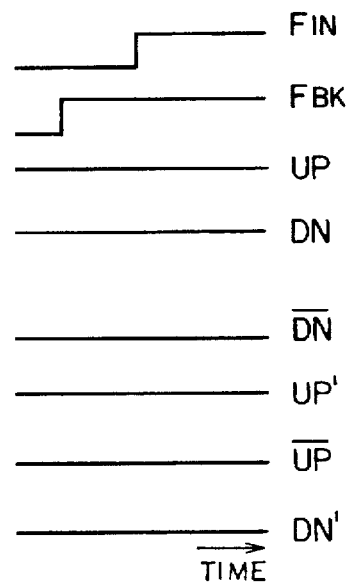
FIG. 10C is a timing diagram representing input and output signals of a phase detector according to the invention, when the second input signal phase leads the first input signal.

Similarly, referring to FIG. 10C, in the presence of a small degree of phase error, with $F_{BK}$ leading $F_{IN}$, a falling edge is received on the DN signal by gate 99 before a falling edge is received on the UP signal by the other gate 97. A pulse is produced on the output signal DN' of gate 99 from the moment the falling edge on DN is received until the rising edge of $\overline{UP}$ is received, one inverter delay after the falling edge of the UP signal. The inverter delay introduces a widening of the pulse equivalent to the narrowing of the pulse due to the rise time requirement of the NOR gate 99. The output pulse on DN' is then of the same duration as the difference between the UP and DN signals, being the period of phase error. No pulses are produced on the UP' output, as NOR gate 97 never receives both inputs at a LOW level.

The circuit of the invention provides a phase detector circuit suitable for operation at high speed and low supply voltages due to a reduction in the number of transistors, and hence associated capacitances which need to be charged at any one time. By using only three transistors of first, first and second channel types in series, a maximum of two transistors—those of the first channel type—are turned on at any one time. Only a maximum of two associated capacitances therefore need to be charged or discharged at the same time. The use of only three transistors in series and a 3.3V supply voltage fulfils the requirement of about 1V drain to source potential for reliable operation of each transistor. The reduced number of circuit elements means a lower power consumption, and the smaller circuit size means that the circuit is cheaper to produce.

The dead zone of the circuit is further reduced over those of known phase detectors. The outputs of the phase detector always have a minimum width pulse. This ensures that the differential amplifier or charge pump has enough time to turn on. Even a very small phase error, represented by a small difference in width of pulses on the UP and DN outputs, will be interpreted in full by the differential amplifier or charge pump. When used with the additional circuitry, output pulses are boosted by the addition of one inverter delay, to ensure switching of the differential amplifier or charge pump with a smaller phase error than would otherwise be possible, whereas with the inputs in phase, no output pulses capable of switching the differential amplifier or charge pump are produced. The increased response speed means that a phase error will be detected very quickly.

Having thus described one particular embodiment of the invention, various alterations, modifications and improvements will readily occur to those skilled in the art. Such alterations, modifications and improvements are intended to be part of this disclosure though not expressly stated herein, and are intended to be within the spirit and scope of the invention. Accordingly, the foregoing description is by way of example only and is not intended as limiting. The invention is limited only as defined in the following claims, and the equivalents thereto.

What is claimed is:

1. A circuit for detecting a difference in phase between a first input signal and a second input signal, comprising:
   first and second sub-circuits, receiving the first and second input signals, and generating first and second intermediate signals, respectively, each of the first and second intermediate signals including a pulse generated in response to an edge transition of a respective one of the first and second input signals, each pulse having a short duration compared with a period of the first and second input signals;
   first and second resettable pulse detection circuits, each having an input terminal receiving one of the first and second intermediate signals, respectively, and each providing an output terminal conveying an output signal, each output signal generating a first stable state responsive to an active signal being received on a reset terminal of the respective pulse detection circuit and generating a second stable state responsive to a pulse being received on the respective input terminal; and
   resetting circuitry coupled to the output terminals constructed and arranged to detect when both output signals are in said second stable state, and to supply an active reset signal to the reset terminal of each of the resettable pulse detection circuits to return the first and second output signals to said first stable state.

2. The circuit according to claim 1, wherein each of the resettable pulse detection circuits comprises:
   first, second, and third transistors of first, and second channel types respectively, coupled in series between first and second supply voltages, the first and third transistors each having a control electrode coupled to said reset terminal and the second transistor having a control electrode coupled to said input terminal; and
   latching means for retaining a state of a node between said second and third transistors and for retaining an inverse of said state of the node at the output terminal.

3. The circuit according to claim 1, further comprising masking circuitry having inputs coupled to the output terminals and generating a pair of output signals that are active only one at a time.

4. A circuit according to claim 3 wherein the masking circuitry comprises:
   a first inverter having an input that receives the output signal of the first resettable pulse detection circuit, and an output that provides an inverse of the output signal of the first resettable pulse detection circuit;
   a second inverter having an input that receives the output signal of the second resettable pulse detection circuit, and an output that provides an inverse of the output signal of the second resettable pulse detection circuit; and
   a first and a second NOR gate each connected so as to receive on a first input one of the output signals of the resettable pulse detection circuits, and to receive on a second input a respective one of the inverse of the output signal of the first resettable pulse detection circuit and the inverse of the output signal of the second resettable pulse detection circuit.

5. The circuit according to claim 1, wherein each of the sub-circuits comprises a NAND gate and a series arrangement of an odd number of inverters coupled in series between two inputs of the NAND gate, an input to each sub-circuit being applied to an input of the series arrangement of the odd number of inverters and to one of the inputs of the NAND gate of each sub-circuit.

6. The circuit of claim 1, wherein each of the sub-circuits includes only a logic gate and an odd number of logic gates coupled in series between two inputs of the logic gate, an input to each sub-circuit being applied to an input of the respective odd number of logic gates and to one of the inputs of the respective logic gate.

7. The circuit of claim 6 wherein each of the odd number of logic gates is an inverter.

8. The circuit of claim 1, wherein each of the sub-circuits includes means for setting and resetting each pulse in response to only an edge of the respective input signal.

9. A phase detector circuit, comprising:
   first and second pulse generators, each providing a pulse at a respective output terminal in response to only a single edge at a respective input terminal;
   first and second resettable latches, each having an input terminal coupled to one of the output terminals of the first and second pulse generators, and generating first and second phase signals, each providing a first stable state upon a receipt of a pulse on its input terminal;
   a resetting circuit, coupled to the first and second phase signals, that generates a reset signal to activate the first and second resettable latches for providing a second stable state on the first and second phase signals responsive to the first and second phase signals both providing the first stable state.

10. The phase detector circuit of claim 9, wherein each of the first and second pulse generators includes:
    a logic gate having two inputs and generating an active state when both of its inputs are in an active state;
    a non-inverting circuit path coupling the input terminal to a first of the two inputs of the logic gate; and
    an inverting circuit path coupling the input terminal to a second of the two inputs of the logic gate;
    wherein the non-inverting and inverting circuit paths have different propogation delays.

11. The phase detector circuit of claim 10, wherein the logic gate is a NAND gate.

12. The phase detector circuit of claim 11, wherein the first circuit path includes an odd number of inverter circuits.

13. The phase detector circuit of claim 9, wherein each resettable latch provides the first stable state at its respective phase signal upon receipt of a leading edge of the respective pulse.

14. The phase detector circuit of claim 13, wherein each resettable latch provides the second stable state upon receipt of a leading edge of a pulse on the reset signal.

15. The phase detector circuit of claim 14, wherein the second stable state provided upon the leading edge of the reset signal is generated regardless of a state of the pulse on the input terminal of the respective resettable latch.

16. The phase detector circuit of claim 9, wherein each resettable latch includes:
   first and second transistors, series coupled between first and second supply voltages;
   first and second inverter circuits coupled together in inverse parallel to form a latch having an input terminal coupled to a junction of the first and second transistors and an output terminal providing a latched output signal.

17. The phase detector circuit of claim 16, wherein-the first and second transistors are of opposite conductivity types.

18. The phase detector circuit of claim 17, wherein the first transistor has a control terminal coupled to the respective input terminal of the resettable latch and the second transistor has a control terminal receiving the reset signal.

19. The phase detector circuit of claim 18, further comprising a third transistor, having the same conductivity type as the first transistor, and having a control terminal receiving the reset signal, wherein the third, first, and second transistors are sequentially connected in series between the first and second supply voltages.

20. The phase detector circuit of claim 19, wherein the first inverter circuit has an input coupled to the junction of the first and second transistors and an output providing one of the first and second phase signals, and the second inverter circuit has an input coupled to the output of the first inverter circuit and provides an output coupled to the junction of the first and second transistors.

21. The phase detector circuit of claim 20, wherein the second inverter circuit is provided with output stage transistors having a current drive capability that is lower than a current drive capability of the first and second transistors.

22. The phase detector circuit of claim 18, wherein the first inverter circuit has an input coupled to the junction of the first and second transistors and an output providing one of the first and second phase signals, and the second inverter circuit has an input coupled to the output of the first inverter circuit and provides an output coupled to the junction of the first and second transistors.

23. The phase detector circuit of claim 22, wherein the second inverter circuit is provided with output stage transistors having a current drive capability that is lower than a current drive capability of the first and second transistors.

24. The phase detector circuit of claim 9, further comprising first and second logic gates, each having a first input coupled to the first and second phase signals, respectively, and a second input coupled, through an inverter circuit, to the second and first phase signals, respectively.

25. The circuit of claim 9, wherein each of the pulse generators includes only a logic gate and an odd number of logic gates coupled in series between two inputs of the logic gate, an input to each sub-circuit being applied to an input of the respective odd number of logic gates and to one of the inputs of the respective logic gate.

26. The circuit of claim 9, wherein each of the pulse generators includes means for setting and resetting each pulse in response to only an edge of the respective input signal.

27. A phase detector circuit, comprising:
   first means for generating a pulse responsive to only a single change of state of a first input signal;
   second means for generating a pulse responsive to only a single change of state of a second input signal;
   latching means, coupled to the first and second means for generating, for providing first and second latched output signals, respectively, each latched output signal providing a first stable state responsive to a receipt of a pulse from the respective first and second means for generating;
   resetting means, coupled to the first and second latched output signals, for generating a reset signal to reset the latching means so that the latched output signals provide a second stable state.

28. The phase detector circuit of claim 27, wherein the change of state is an edge transition of a digital signal.

29. The phase detector circuit of claim 27, wherein each of the first and second means for generating includes:
   comparison means having two inputs for generating an active signal responsive to both its inputs being in an active state;
   means for conveying the respective input signal to one of the two inputs of the comparison means, free of inverting means; and
   means for conveying the respective input signal to the other of the two inputs of the comparison means, including inverting means;
   wherein the first and second means for conveying have different propagation delays.

30. The phase detector circuit of claim 27, wherein the latching means includes means for providing the first stable state in response to a leading edge of the respective pulse.

31. The phase detector circuit of claim 30, wherein the resetting means includes means for generating a reset pulse and for providing the second stable state responsive to a leading edge of the reset pulse.

32. The phase detector circuit of claim 27, wherein the latching means includes two latching circuits, each comprising:
   a first switching means, coupled to a first supply voltage and a drive terminal, for coupling the drive terminal to the first supply voltage in response to a first control signal;
   a second switching means, coupled to a second supply voltage and the drive terminal, for coupling the drive terminal to second first supply voltage in response to a second control signal;
   first inverting means for inverting a drive signal present at the drive terminal to generate an output signal; and
   second inverting means, responsive to the output signal, for maintaining a voltage of the drive signal when the drive terminal is not coupled to either the first supply voltage or the second supply voltage.

33. The circuit of claim 32, wherein the first control signal is coupled to one of the first and second means for generating, and wherein the second control signal is coupled to the reset signal.

34. The phase detector circuit of claim 33, wherein the first and second inverting means each includes an inverting circuit.

35. The phase detector circuit of claim 34, wherein the second inverting means includes means for supplying current at a level lower than a current level suppliable by the first and second switching means.

36. The phase detector circuit of claim 32, wherein the first and second switching means provide a conductive state responsive to control signals having opposite polarity.

37. The phase detector circuit of claim 36, further including a third switching means, coupled in series with the first and second switching means, having a control terminal coupled to the reset signal.

38. The circuit of claim 27, wherein:

the first means includes means for setting and resetting a first signal to generate the first pulse in response to only an edge of the first input signal; and the second means includes means for setting and resetting a second signal to generate the second pulse in response to only an edge of the second input signal.

39. The circuit of claim 27, further comprising means for masking the first and second latched output signals to generate an output signal active only when one of the first and second latched output is active.

40. A method for detecting a phase difference, comprising:

A) generating a first pulse in response to only a single change of state of a first input signal;

B) generating a second pulse in response to only a single change of state of a second input signal;

C) latching the first and second pulses to respectively provide a first predetermined state on first and second latched output signals; and D) resetting the first and second latched output signals to a second predetermined state responsive to the first and second latched output signals both entering the first predetermined state.

41. The method as set forth in claim 40, wherein the steps A and B of generating each include:

conveying the first input signal to a first input of a logic gate through a non-inverting path;

conveying the first input signal to a second input of the logic gate through an inverting path;

wherein the steps of conveying include delaying the input signal by different propagation delays.

42. The method of claim 40, wherein the step C of latching includes supplying the first predetermined state responsive to a leading edge of the respective pulse.

43. The method as set forth in claim 42, wherein the step of resetting includes generating a reset pulse responsive to the first and second latch output signals both entering the first predetermined state, wherein the first and second latch output signals are reset to the second predetermined state in response to a leading edge of the reset pulse.

44. The method of claim 40, wherein:

step A) includes setting and resetting a first signal to generate the first pulse in response to only an edge of the first input signal; and step B) includes setting and resetting a second signal to generate the second pulse in response to only an edge of the second input signal.

45. The method of claim 40, further comprising a step of masking the first and second latched output signals to generate an output signal active only when one of the first and second latched output signals is active.

46. A method for generating signals indicative of a phase difference between a first input signal and a second input signal, the method comprising the steps of:

A) generating a first pulse in response to an edge transition of the first input signal, the first pulse having a short duration compared with a period of the first input signal;

B) generating a second pulse in response to an edge transition of the second input signal, the second pulse having a short duration compared with a period of the second input signal;

C) latching the first pulse to activate a first output signal;

D) latching the second pulse to activate a second output signal; and

E) deactivating the first output signal and the second output signal in response to the first output signal and the second output signal both being activated.

47. The method of claim 46, wherein step A includes:

conveying the first input signal to a first input of a logic gate through a non-inverting path; and conveying the first input signal to a second input of the logic gate through an inverting path;

wherein the steps of conveying include delaying the input signal by different propagation delays.

48. The method of claim 46, wherein the step of deactivating includes generating a reset pulse responsive to the first output signal mad the second output signal both being activated, the reset pulse causing each of the first and second output signals to be deactivated.

49. The method of claim 46, further comprising a step of masking the first and second output signals to generate an output signal active only when one of the first and second output signals is active.

50. An apparatus for generating signals indicative of a phase difference between a first input signal and a second input signal, the apparatus comprising:

first means for generating a first pulse in response to an edge transition of the first input signal, the first pulse having a short duration compared with a period of the first input signal;

second means for generating a second pulse in response to an edge transition of the second input signal, the second pulse having a short duration compared with a period of the second input signal;

third means for latching the first pulse to activate a first output signal;

fourth means for latching the second pulse to activate a second output signal; and fifth means for deactivating the first output signal and the second output signal in response to the first output signal and the second output signal both being activated.

51. The apparatus of claim 50, wherein the first means includes first means for conveying the first input signal to a first input of a logic gate through a non-inverting path; and second conveying the first input signal to a second input of the logic gate through an inverting path;

wherein the first and second means for conveying each includes a means for delaying the input signal by different propagation delays.

52. The apparatus of claim 50, wherein means for deactivating includes means for generating a reset pulse responsive to the first output signal and the second output signal both being activated, the reset pulse causing each of the first and second output signals to be deactivated.

53. The apparatus of claim 50, further comprising means for masking the first and second output signals to generate an output signal active only when one of the first and second output signals is active.

* * * * *